United States Patent
Yokoi et al.

(10) Patent No.: US 8,643,182 B2
(45) Date of Patent: Feb. 4, 2014

(54) SEMICONDUCTOR FILM, METHOD FOR MANUFACTURING THE SAME, AND POWER STORAGE DEVICE

(71) Applicant: Semiconductor Energy Laboratory Co., Ltd., Atsugi (JP)

(72) Inventors: Tomokazu Yokoi, Kanagawa (JP); Takayuki Inoue, Kanagawa (JP); Makoto Furuno, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/908,047

(22) Filed: Jun. 3, 2013

(65) Prior Publication Data

US 2013/0270679 A1    Oct. 17, 2013

Related U.S. Application Data

(62) Division of application No. 13/301,020, filed on Nov. 21, 2011, now Pat. No. 8,455,044.

(30) Foreign Application Priority Data

Nov. 26, 2010 (JP) .................................. 2010-263710

(51) Int. Cl.
*H01L 23/12* (2006.01)

(52) U.S. Cl.
USPC ......................... 257/757; 438/655; 427/126.1

(58) Field of Classification Search
USPC ............ 257/737, 756, 757, 758, 768; 427/77, 427/96.8, 97.1, 126.1; 438/492, 488, 652, 438/656, 657, 664, 682, 683, 684, 685
See application file for complete search history.

(56) References Cited

U.S. PATENT DOCUMENTS

| | | | |
|---|---|---|---|
| 5,643,826 A | 7/1997 | Ohtani et al. | |
| 5,705,829 A | 1/1998 | Miyanaga et al. | |

(Continued)

FOREIGN PATENT DOCUMENTS

| | | |
|---|---|---|
| JP | 07-130652 | 5/1995 |
| JP | 07-183535 | 7/1995 |
| JP | 07-183536 | 7/1995 |
| JP | 07-183537 | 7/1995 |

(Continued)

OTHER PUBLICATIONS

Kamins et al., "Ti-catalyzed Si nanowires by chemical vapor deposition: Microscopy and growth mechanisms", Journal of Applied Physics, vol. 89, No. 2, Jan. 15, 2001, pp. 1008-1016.

(Continued)

*Primary Examiner* — Julio J Maldonado
*Assistant Examiner* — Robert Bachner
(74) *Attorney, Agent, or Firm* — Nixon Peabody LLP; Jeffrey L. Costellia

(57) ABSTRACT

Provided are a semiconductor film including silicon microstructures formed at high density, and a manufacturing method thereof. Further, provided are a semiconductor film including silicon microstructures whose density is controlled, and a manufacturing method thereof. Furthermore, a power storage device with improved charge-discharge capacity is provided. A manufacturing method in which a semiconductor film with a silicon layer including silicon structures is formed over a substrate with a metal surface is used. The thickness of a silicide layer formed by reaction between the metal and the silicon is controlled, so that the grain sizes of silicide grains formed at an interface between the silicide layer and the silicon layer are controlled and the shapes of the silicon structures are controlled. Such a semiconductor film can be applied to an electrode of a power storage device.

16 Claims, 12 Drawing Sheets

(56) References Cited

U.S. PATENT DOCUMENTS

| | | | |
|---|---|---|---|
| 6,165,824 | A | 12/2000 | Takano et al. |
| 6,685,804 | B1 | 2/2004 | Ikeda et al. |
| 6,887,511 | B1 | 5/2005 | Shima et al. |
| 7,015,496 | B2 | 3/2006 | Ohnuma et al. |
| 7,192,673 | B1 | 3/2007 | Ikeda et al. |
| 7,235,330 | B1 | 6/2007 | Fujimoto et al. |
| 7,241,533 | B1 | 7/2007 | Ikeda et al. |
| 7,396,409 | B2 | 7/2008 | Hatta et al. |
| 7,410,728 | B1 | 8/2008 | Fujimoto et al. |
| 7,658,871 | B2 | 2/2010 | Matsubara et al. |
| 7,794,881 | B1 | 9/2010 | Fujimoto et al. |
| 2002/0168574 | A1 | 11/2002 | Ahn et al. |
| 2005/0042128 | A1 | 2/2005 | Matsubara et al. |
| 2008/0297981 | A1 | 12/2008 | Endo et al. |
| 2010/0209784 | A1 | 8/2010 | Yamazaki et al. |
| 2011/0151290 | A1 | 6/2011 | Cui et al. |

FOREIGN PATENT DOCUMENTS

| | | |
|---|---|---|
| JP | 10-247735 | 9/1998 |
| JP | 2001-210315 | 8/2001 |
| JP | 2002-083594 | 3/2002 |
| JP | 2003-246700 | 9/2003 |
| JP | 2004-224576 | 8/2004 |
| JP | 2004-281317 | 10/2004 |
| JP | 2005-071772 | 3/2005 |
| JP | 2007-299580 | 11/2007 |
| JP | 2008-294314 | 12/2008 |

OTHER PUBLICATIONS

Kohno et al., "Silicon Nanoneedles Grown by a Simple Thermal Treatment Using Metal-Sulfur Catalysts", Japanese Journal of Applied Physics, Feb. 1, 2002, vol. 41, No. 2A, pp. 577-578.

Cui et al., "Crystalline-Amorphous Core-Shell Silicon Nanowires for High Capacity and High Current Battery Electrodes", Nano Letters, 2009, vol. 9, No. 1, pp. 491-495.

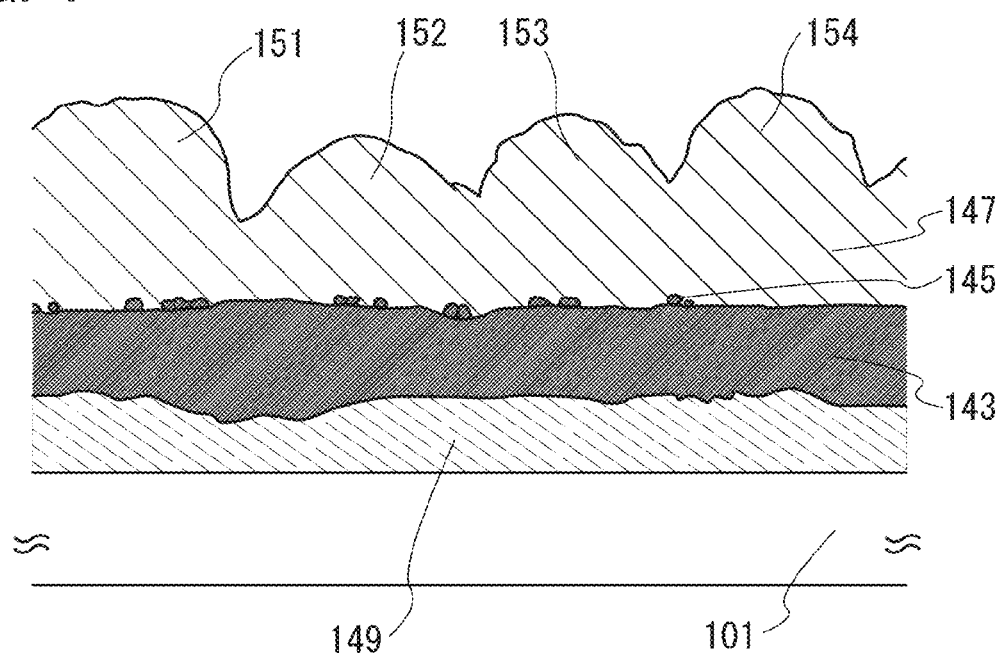

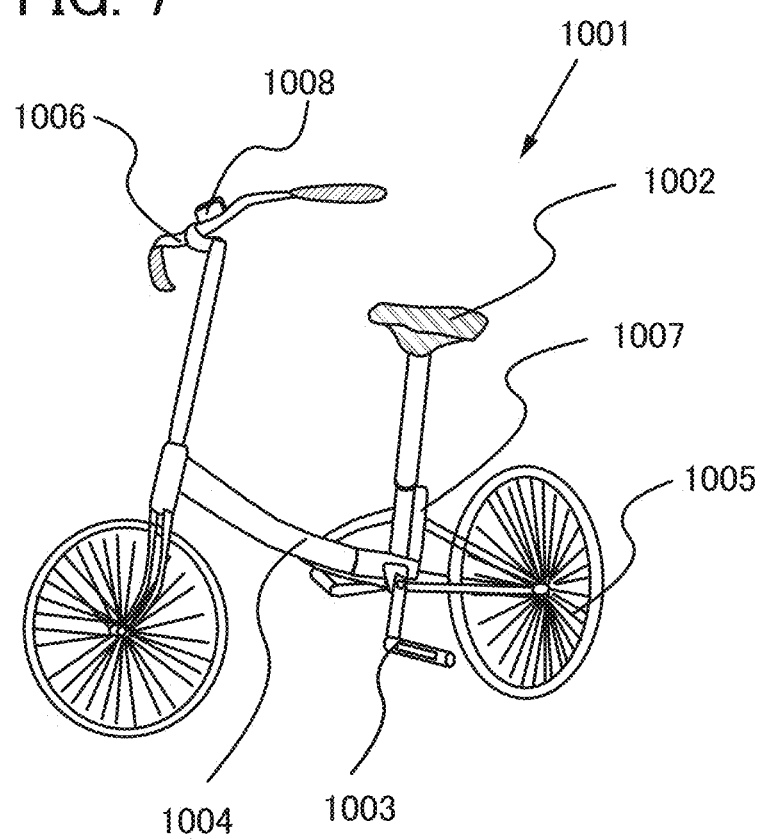

SEMICONDUCTOR FILM, METHOD FOR MANUFACTURING THE SAME, AND POWER STORAGE DEVICE

BACKGROUND OF THE INVENTION

1. Field of the Invention

The present invention relates to a semiconductor film and a method for manufacturing the semiconductor film. The present invention relates to a power storage device.

Note that the power storage device refers to all elements and devices which have a function of storing power.

2. Description of the Related Art

In recent years, high-performance power storage devices such as lithium-ion secondary batteries, lithium-ion capacitors, and air cells have been developed.

An electrode for the power storage device is manufactured by providing an active material over a surface of a current collector. As the active material, a material such as carbon or silicon, which can store and release ions serving as carriers, is used. For example, silicon or phosphorus-doped silicon has higher theoretical capacity than carbon and is advantageous in increasing the capacity of a power storage device (e.g., Patent Document 1).

On the other hand, a needle-like microstructure is known, which is expected to be applied to a power storage device including an ion-transferring secondary battery (e.g., a lithium ion battery), with its external characteristics.

As the needle-like silicon microstructure, a silicon nanoneedle formed by a vapor-liquid-solid (VLS) growth method is known (see Patent Document 2). A silicon nanoneedle is a single crystal needle-like structure obtained from a single crystal substrate; for example, the diameter of an end portion is 300 nm or less and the length is approximately 90 μm or less.

REFERENCE

Patent Document

[Patent Document 1] Japanese Published Patent Application No. 2001-210315
[Patent Document 2] Japanese Published Patent Application No. 2003-246700

SUMMARY OF THE INVENTION

When needle-like structures are used for an active material of a power storage device, the surface area can be increased; thus, advantageous effects such as increase in charge-discharge capacity and improvement in charge-discharge characteristics are expected. In the case where silicon microstructures are used for a negative electrode active material of a power storage device, it is expected to increase the charge-discharge capacity of the power storage device as the silicon microstructures are formed at higher density in the power storage device. However, it has been difficult to achieve high-density formation by a method for manufacturing a silicon nanoneedle using a conventional VLS growth method.

The present invention is made in view of the foregoing technical background. Accordingly, an object of one embodiment of the present invention is to provide a semiconductor film including silicon microstructures formed at high density and a manufacturing method thereof. Further, an object of one embodiment of the present invention is to provide a semiconductor film including silicon microstructures whose density is controlled, and a manufacturing method thereof. Furthermore, an object of one embodiment of the present invention is to provide a power storage device with improved charge-discharge capacity.

In order to achieve the above objects, the present invention focuses on silicon microstructures formed over a metal surface. The silicon microstructures are formed in such a manner that a silicon film is formed over a metal surface by a deposition method such as a low pressure chemical vapor deposition (LPCVD) method or a plasma enhanced chemical vapor deposition (PECVD) method.

As a result of earnest study of formation mechanism of the silicon structures, the present inventors have found that projections and depressions are formed in the vicinity of a surface of a silicide layer due to compressive stress generated due to volume expansion in silicide reaction of a metal, and that a grain size of a silicide grain which is detached from the projection is closely related to the shape of the silicon structure.

Further, the present inventors have arrived at the invention of a semiconductor film including silicon structures of various shapes, which are formed by controlling the grain sizes of silicide grains which are nuclei of growth of the silicon structures.

For example, in the case where a needle-like silicon whisker is formed, a minute silicide grain may be generated only in the vicinity of a surface by silicide reaction and a silicon structure may be formed using the silicide grain as a nucleus of growth. When silicide reaction is caused only in the vicinity of a surface, compressive stress generated due to volume expansion accompanying the silicide reaction concentrates in a direction toward the surface of the silicide layer; thus, in the surface of the silicide layer, the height difference of the depressions and the projections becomes large and the interval of the same becomes small. As a result, the silicide grain which is detached from the projection of the surface of the silicide layer becomes extremely minute, and a silicon structure which grows from the minute silicide grain is likely to become a needle-like silicon whisker. A semiconductor film including a needle-like silicon whisker formed by such a method includes a minute silicide grain in the vicinity of an interface between a silicon layer and the silicide layer. The grain size of the silicide grain is greater than or equal to 1 nm and less than 50 nm.

In contrast, in the case where a large silicide grain is formed, silicide reaction preferably proceeds deep in a film thickness direction (toward a metal layer). In that case, compressive stress generated due to volume expansion accompanying the silicide reaction is relieved in the film thickness direction. As a result, the height difference of the depressions and the projections becomes small and the interval of the same becomes large. Accordingly, the grain size of the silicide grain detached from the projection becomes large. A silicon structure which grows from the thus obtained large silicide grain is likely to have not a needle-like shape but a hemispherical (dome-like) shape. A semiconductor film including a hemispherical (dome-like) silicon structure manufactured by such a method includes a large silicide grain around an interface between a silicon layer and the silicide layer. The grain size of the silicide grain is greater than or equal to 50 nm.

As a metal included in the metal layer, a metal which forms silicide by reacting with silicon is used. As an example of a metal which forms silicide, titanium (Ti), nickel (Ni), cobalt (Co), zirconium (Zr), hafnium (Hf), vanadium (V), niobium (Nb), tantalum (Ta), chromium (Cr), molybdenum (Mo), tungsten (W), and the like can be given. In particular, it is preferable to use titanium which has relatively low diffusion coefficient with respect to silicon because the thickness of the silicide layer can be highly controlled.

Further, existence of a large number of silicide grains over the silicide layer means that the surface roughness of the silicide layer is large. Thus, the anchoring effect can be obtained between the silicide layer and the silicon layer to improve adhesion therebetween.

In other words, one embodiment of the present invention is a semiconductor film including a silicide layer containing a metal, a silicide grain over the silicide layer, and a silicon layer in contact with the silicide layer and the silicide grain. The silicon layer includes a needle-like silicon structure. The thickness of the silicide layer is greater than or equal to 1 nm and less than 100 nm. The grain size of the silicide grain is greater than or equal to 1 nm and less than 50 nm.

One embodiment of the present invention is a semiconductor film including a silicide layer containing a metal, a silicide grain over the silicide layer, and a silicon layer in contact with the silicide layer and the silicide grain. The silicon layer includes a dome-like silicon structure. The thickness of the silicide layer is greater than or equal to 100 nm. The grain size of the silicide grain is greater than or equal to 50 nm.

One embodiment of the present invention is a semiconductor film including a first region including either of the above semiconductor films and a second region including a metal layer containing the above metal, an insulating layer over the metal layer, and a second silicon layer over the insulating layer. The first region and the second region are formed over one substrate. The silicon layer included in the first region and the second silicon layer are continuous.

An insulating layer for covering a metal layer may be formed, an opening may be selectively formed in the insulating layer so that the metal layer is exposed, and a silicon layer which includes a silicon structure only in the opening may be formed. The silicon structure can be thus selectively formed, so that the density of the silicon structures in the substrate can be controlled as appropriate. The silicon structures whose density is thus controlled are used for an active material of an electrode of a power storage device, whereby destruction by interference or contact of silicon structures due to volume expansion in charge and discharge can be suppressed, and a highly reliable power storage device can be provided.

In one embodiment of the present invention, in any of the semiconductor films described above, the silicide layer and the silicide grain contain titanium.

One embodiment of the present invention is a method for manufacturing a semiconductor film, including the steps of: forming, on a surface of a metal layer, a silicide layer including a metal element included in the metal layer and transforming part of the silicide layer into a silicide grain; and forming a silicon layer including a silicon structure over the silicide layer. The shape of the silicon structure is controlled by the thickness of the silicide layer.

One embodiment of the present invention is a method for manufacturing a semiconductor film, including the steps of: forming, on a surface of a metal layer, a silicide layer including a metal element included in the metal layer and transforming part of the silicide layer into a silicide grain; and forming a silicon layer including a needle-like silicon structure over the silicide layer. The thickness of the silicide layer is greater than or equal to 1 nm and less than 100 nm. The grain size of the silicide grain is greater than or equal to 1 nm and less than 50 nm.

One embodiment of the present invention is a method for manufacturing a semiconductor film, including the steps of: forming, on a surface of a metal layer, a silicide layer including a metal element included in the metal layer and transforming part of the silicide layer into a silicide grain; and forming a silicon layer including a dome-like silicon structure over the silicide layer. The thickness of the silicide layer is greater than or equal to 100 nm. The grain size of the silicide grain is greater than or equal to 50 nm.

In one embodiment of the present invention, in any of the methods for manufacturing a semiconductor film described above, the silicide layer and the silicide grain contain titanium.

Further, one embodiment of the present invention is a power storage device including any of the above semiconductor films.

When any of the semiconductor films including a microstructure of one embodiment of the present invention is applied to a power storage device, charge-discharge capacity of the power storage device can be improved.

Note that in this specification and the like, a semiconductor film means a film having semiconductor characteristics and a stacked film including a film having semiconductor characteristics. For example, even a stacked film in which a metal layer or an insulating film is stacked over a film having semiconductor characteristics is referred to as a semiconductor film.

Note that in this specification and the like, the grain size of a grain is defined as the longest distance between two points in any cross section of the grain.

Note that in this specification and the like, among silicon microstructures, a needle-like silicon microstructure (including a stick-like silicon microstructure and a branch-like silicon microstructure) is referred to as a needle-like silicon structure, a needle-like silicon whisker, or a silicon whisker. A dome-like silicon microstructure (including a hemispherical silicon microstructure and a columnar silicon microstructure having a hemispherical tip) is referred to as a dome-like silicon structure. Note that these are simply referred to as a silicon structure in some cases.

According to one embodiment of the present invention, a semiconductor film including silicon microstructures formed at high density and a manufacturing method thereof can be provided. Further, a semiconductor film including silicon microstructures whose density is controlled and a manufacturing method thereof can be provided. Furthermore, a power storage device in which charge-discharge capacity is improved can be provided.

BRIEF DESCRIPTION OF THE DRAWINGS

In the accompanying drawings:

FIG. 4 illustrates a semiconductor film according to one embodiment of the present invention;

FIG. 7 illustrates an electric bicycle according to one embodiment of the present invention;

DETAILED DESCRIPTION OF THE INVENTION

Figure 1A:
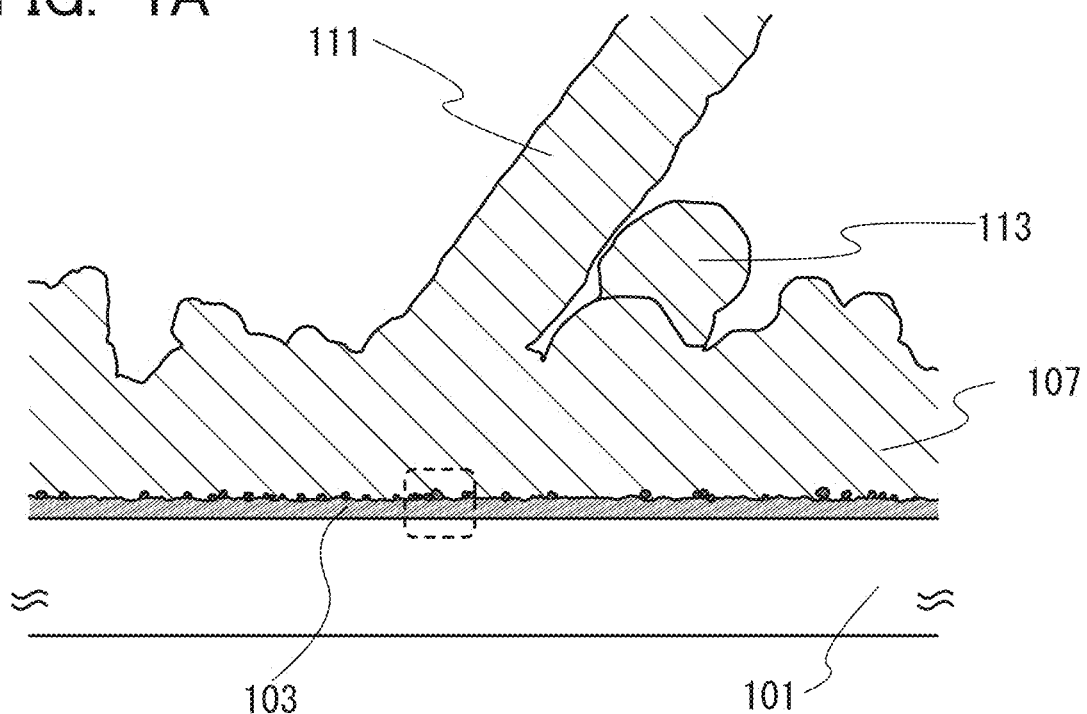
FIGS. 1A and 1B illustrate a semiconductor film according to one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments and examples. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, according to one embodiment of the present invention, a semiconductor film including a silicon structure and a manufacturing method thereof will be described with reference to FIGS. 1A and 1B, FIGS. 2A and 2B, FIGS. 3A and 3B, and FIG. 4.

<Structural Example of Semiconductor Film>

FIG. 1A is a schematic cross-sectional view of a semiconductor film including needle-like silicon whiskers, which is described in this embodiment.

The semiconductor film according to one embodiment of the present invention is formed over a substrate 101 and includes a silicide layer 103, minute silicide grains 105 over the silicide layer 103, and a silicon layer 107 which is in contact with the silicide layer 103 and the silicide grains 105 and covers the silicide layer 103 and the silicide grains 105. The silicon layer 107 includes needle-like silicon whiskers 111 and 113.

The silicide layer 103 includes a silicide resulting from reaction of a metal included in a metal layer 109 described later and silicon. The silicide grains 105 include elements same as those included in the silicide layer 103. Although the silicide layer 103 and the silicide grains 105 include the same elements, compositions and crystal structures thereof may differ from each other.

FIG. 1A illustrates a cross section along the long axis direction of the needle-like silicon whisker 111 and a cross section along a direction approximately perpendicular to the long axis direction of the needle-like silicon whisker 113. Since a boundary between the silicon layer 107 and the silicon whiskers 111 and 113 is not clear, the boundary is not clearly illustrated.

The silicon layer 107 and the needle-like silicon whiskers 111 and 113 have crystallinity. Further, the needle-like silicon whiskers 111 and 113 may have uniaxial orientation in their respective long axis directions.

Figure 1B:
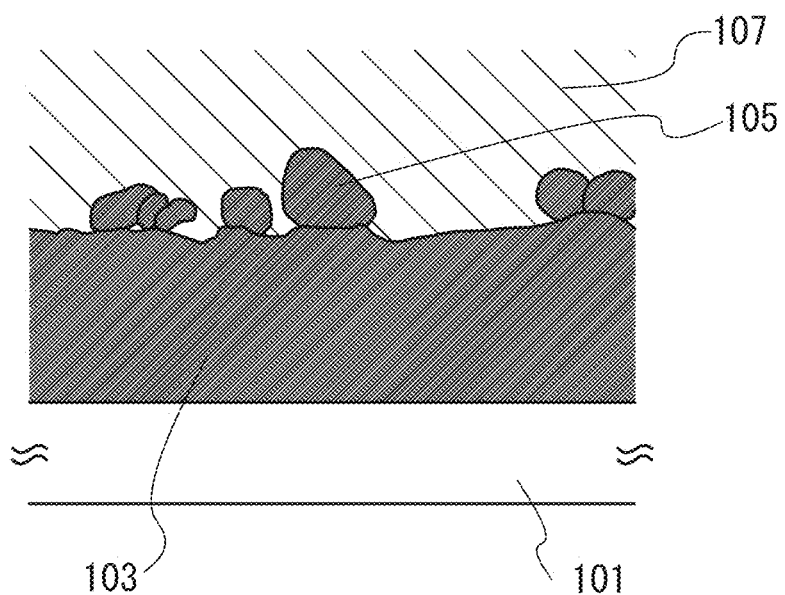

FIG. 1B illustrates an enlarged view of a region including the silicide grains 105 around a boundary between the silicon layer 107 and the silicide layer 103, which is surrounded by a dashed line in FIG. 1A.

A surface of the silicide layer 103 is uneven. A large number of the silicide grains 105 exists in the vicinity of or adjacent to the surface.

The thickness of the silicide layer 103 is greater than or equal to 1 nm and less than 100 nm, preferably greater than or equal to 1 nm and less than 50 nm.

The shape of the silicide grains 105 is not limited as long as it is a grain shape. The silicide grains 105 may be spherical, elliptical, or the like. Further, the grain size thereof is greater than or equal to 1 nm and less than 50 nm. In this specification and the like, the grain size of a silicide grain is defined as the longest distance between two points in any cross section of the grain.

Here, compositions of the silicide layer 103 and the silicide grains 105 are described. Silicide included therein does not necessarily have a uniform composition over the inside of the silicide layer 103 or the silicide grains 105. In the silicide layer 103, the proportion of silicon contained tends to be higher toward the boundary with the silicon layer 107. The silicide grains 105 include silicide having high proportion of silicon (i.e., silicon-rich silicide), as in the region of the silicide layer 103, which is close to the interface with the silicon layer 107. On the other hand, a region of the silicide layer 103 which exists deep in the film thickness direction includes silicide having low proportion of silicon, and a metal which is not silicided remains depending on manufacturing conditions in some cases.

<Method for Manufacturing Semiconductor Film>

Next, a method for manufacturing a semiconductor film including needle-like silicon whiskers will be described with reference to FIGS. 2A and 2B.

First, the metal layer 109 is formed over a substrate 101.

A substrate which can withstand a process temperature in a later step is used as the substrate 101. For example, a glass substrate, a quartz substrate, a ceramic substrate, a semiconductor substrate, or a substrate including a metal can be used. In the case of being used as an electrode of a power storage device, a substrate including a metal is preferably used. The substrate 101 may have a foil shape, a plate shape, or a net shape.

The metal layer 109 is formed using a metal which forms silicide by reacting with silicon. As an example of a metal which forms silicide, titanium (Ti), nickel (Ni), cobalt (Co), zirconium (Zr), hafnium (Hf), vanadium (V), niobium (Nb), tantalum (Ta), chromium (Cr), molybdenum (Mo), tungsten (W), or the like can be given. In particular, it is preferable to use titanium which has relatively small diffusion coefficient with respect to silicon because the thickness of the silicide layer can be highly controlled. In this embodiment, titanium is used as the metal for the metal layer 109.

The metal layer 109 can be formed by a printing method, a sol-gel method, a coating method, an ink-jet method, a sputtering method, an evaporation method, or the like, as appropriate.

The metal layer 109 forms a silicide layer by reacting with silicon in a later step. The thickness of the metal layer 109 is set as appropriate so that the thickness of the silicide layer formed in such a manner that the metal layer 109 entirely reacts with silicon is greater than or equal to 1 nm and less than 100 nm, preferably greater than or equal to 1 nm and less than 50 nm.

Figure 2A:
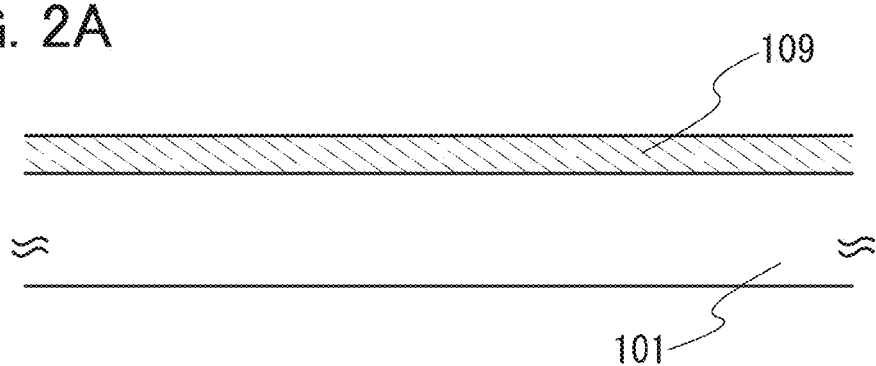
FIGS. 2A and 2B illustrate a method for manufacturing a semiconductor film according to one embodiment of the present invention.

In this embodiment, as the metal layer 109, a titanium film with a thickness of 10 nm is formed by a sputtering method (see FIG. 2A).

Next, silicon is deposited so that the metal element included in the metal layer 109 reacts with silicon and the silicide layer is formed. A variety of deposition methods such as an LPCVD method and a PECVD method can be used as appropriate. For example, in the case where a PECVD method is used, the RF power source frequency in a range of 13.56 MHz to 2.45 GHz may be used and the substrate temperature, the pressure, the gas flow rate, the RF power source, and the like may be adjusted as appropriate so that the metal element included in the metal layer 109 reacts with silicon and a silicide layer with a desired thickness is formed.

In this embodiment, silicon is deposited by an LPCVD method. A source gas including a deposition gas containing silicon is supplied, and the temperature is set to higher than 500° C. and lower than or equal to a temperature which the deposition apparatus and the substrate 101 can withstand, preferably higher than or equal to 580° C. and lower than 650° C.; thus, film deposition is performed. Further, the pressure is set so as to be higher than or equal to the lower limit for keeping to supplying the source gas (e.g., higher than or equal to 5 Pa) and lower than or equal to 1000 Pa, preferably higher than or equal to 5 Pa and lower than or equal to 200 Pa.

Examples of the deposition gas containing silicon include a silicon hydride gas, a silicon fluoride gas, and a silicon chloride gas; typically, $SiH_4$, $Si_2H_6$, $SiF_4$, $SiCl_4$, $Si_2Cl_6$, and the like are given. Hydrogen may be introduced into the above gas. A rare gas such as helium, neon, argon, or xenon, or nitrogen may be mixed in the source gas.

Further, a gas containing an impurity element imparting one conductivity type to silicon, such as phosphorus or boron, may be mixed into the source gas. When silicon to which an impurity element imparting one conductivity type, such as phosphorus or boron, is added is used for a silicon layer and a silicon structure, conductivity thereof can be increased. When silicon to which an impurity element imparting one conductivity type is used for an active material of an electrode of a power storage device, charge-discharge characteristics can be further improved.

Note that the temperature, the pressure, the time, the gas flow rate, and the like of an LPCVD method are adjusted as appropriate so that the metal included in the metal layer 109 reacts with silicon and silicide is formed. In this embodiment, in film deposition, a mixed gas of $SiH_4$ and nitrogen is used as a source gas, the pressure is set to 20 Pa, and the temperature is kept at 600° C. for an hour.

By an LPCVD method, the metal included in the metal layer 109 reacts with silicon, so that the silicide layer 103 is formed. In this embodiment, in almost the entire metal layer 109, silicide reaction occurs in the metal included in the metal layer 109 and the silicide layer 103 is formed. A metal layer which is not silicided remains in a lower portion of the silicide layer 103 depending on conditions in some cases.

A surface of the silicide layer 103 becomes uneven, and the plurality of silicide grains 105 is formed in the vicinity of or adjacent to the surface of the silicide layer 103. The grain sizes of the silicide grains 105 become large in accordance with the thickness of the silicide layer 103. The grain sizes of the silicide grains 105 are greater than or equal to 1 nm and less than 100 nm, preferably greater than or equal to 1 nm and less than 50 nm.

When the metal included in the metal layer 109 is silicided, compressive stress occurs due to its volume expansion. In the case where the thickness of the silicide layer is small, this compressive stress cannot be relieved in the thickness direction and concentrates toward the surface of the silicide layer. As a result, the height difference of depressions and projections becomes large. Accordingly, a silicide grain which is detached from the projection of the surface of the silicide layer can be extremely minute.

Further, ten to several hundred silicide grains thus formed can exist per square micrometer. Depending on the deposition conditions of silicon, in consideration of the fact that the cross-sectional area of a needle-like silicon whisker is approximately several hundred square nanometers to several hundred square micrometers, silicide grains which are nuclei of growth of the needle-like silicon whiskers are distributed at extremely high density. Accordingly, the needle-like silicon whiskers can be formed at extremely high density.

Figure 2B:
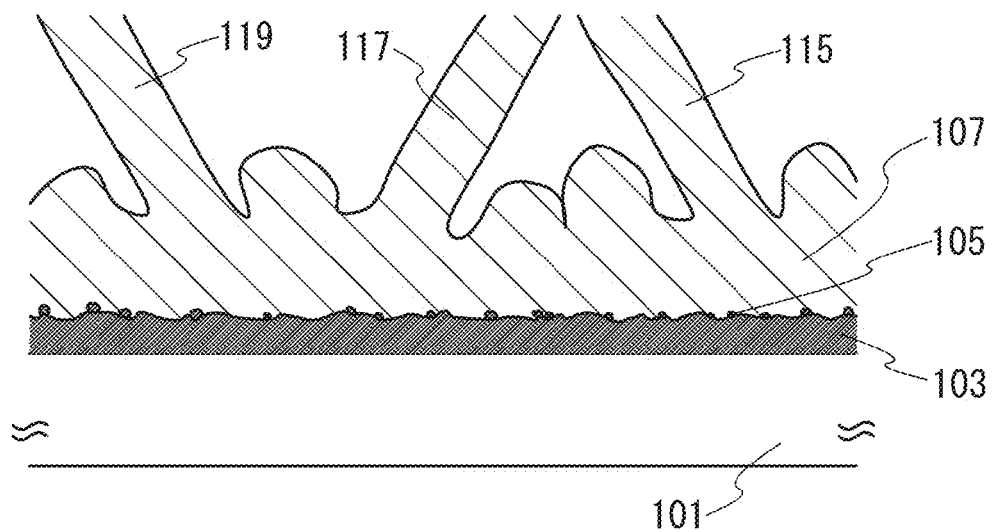

The silicon layer 107 and a plurality of needle-like silicon whiskers (silicon whiskers 115, 117, and 119) are formed so as to be in contact with and to cover the silicide layer 103 and the plurality of silicide grains 105 (FIG. 2B).

The needle-like silicon whiskers grow using the silicide grains 105 as nuclei. As the grain sizes of the silicide grains 105 are smaller, the silicon whiskers are more likely to have a needle-like shape. In addition to the needle-like silicon whiskers, a projection portion is formed on the surface of the silicon layer 107 in some cases.

Through the above steps, a semiconductor film which includes needle-like silicon whiskers at extremely high density can be formed over the substrate 101. The semiconductor film formed through such steps includes the silicide grains 105 in the vicinity of or adjacent to the surface of the silicide layer 103. The thickness of the silicide layer 103 is greater than or equal to 1 nm and less than 100 nm, preferably greater than or equal to 1 nm and less than 50 nm. The grain sizes of the silicide grains 105 are greater than or equal to 1 nm and less than 50 nm.

As described above, according to a manufacturing method of one embodiment of the present invention, a semiconductor film which includes needle-like silicon whiskers at extremely high density can be formed. Further, when such a semiconductor film which includes needle-like silicon whiskers at extremely high density is used for an active material of an electrode of a power storage device, the charge-discharge capacity of the power storage device can be improved.

Modification Example 1

Next, a semiconductor film which includes needle-like silicon whiskers and has a different structure from the above, and a manufacturing method thereof will be described with reference to FIGS. 3A and 3B.

Figure 3A:
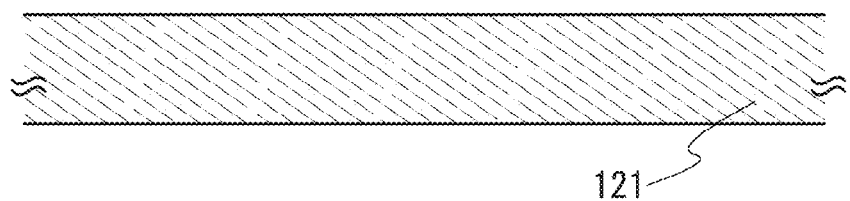
FIGS. 3A and 3B illustrate a method for manufacturing a semiconductor film according to one embodiment of the present invention.
Figure 3B:
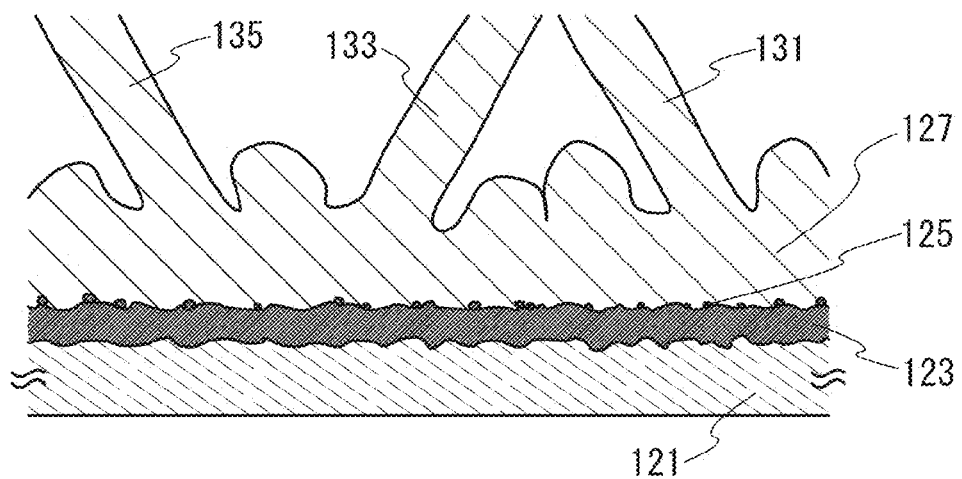

A semiconductor film illustrated in FIG. 3B, which includes needle-like silicon whiskers, includes a silicide layer 123 which is formed by making the vicinity of a substrate 121 including a metal into silicide, and also includes a large number of silicide grains 125 in the vicinity of or adjacent to a surface of the silicide layer 123. Further, a silicon layer 127 including a plurality of needle-like silicon whiskers (silicon whiskers 131, 133, and 135) is included so as to be in contact with and to cover the silicide layer 123 and the large number of silicide grains 125.

The structure of the semiconductor film illustrated in FIG. 3B, which includes the needle-like silicon whiskers, is different from the above structure in that the silicide layer 123 is formed in such a manner that the vicinity of the surface of the substrate 121 including a metal is silicided. Note that points different from the above are described in detail, and the detailed description of the common points is omitted.

A metal capable of forming silicide by reacting with silicon is used for the substrate 121. As the metal capable of forming silicide, metals similar to the metals for the metal layer 109 can be used. In this embodiment, titanium is used as the metal included in the substrate 121.

The silicide layer 123 in which the metal included in the substrate 121 reacts with silicon is formed in the vicinity of the surface of the substrate 121. The thickness of the silicide layer 123 is greater than or equal to 1 nm and less than 100 nm, preferably greater than or equal to 1 nm and less than 50 nm, similar to that of the silicide layer 103.

Further, the large number of silicide grains 125 exists in the vicinity of or adjacent to a surface of the silicide layer 123. The silicide grains 125 have features similar to those of the silicide grains 105.

Note that similarly to the above, the silicide layer 123 and the silicide grains 125 do not necessarily have uniform compositions. The proportion of silicon in the composition tends to be higher toward the interface with the silicon layer 127.

As for the manufacturing method, first, the substrate 121 including a metal is prepared (FIG. 3A). Then, silicon is deposited directly on the substrate 121. At this time, the deposition is performed under such conditions that the thickness of the silicide layer 123 formed on the surface of the substrate 121 is greater than or equal to 1 nm and less than 100 nm, preferably greater than or equal to 1 nm and less than 50 nm; thus, the silicon layer 127 and the plurality of needle-like silicon whiskers (the silicon whiskers 131, 133, and 135) can be formed as illustrated in FIG. 3B.

Modification Example 2

In contrast to the above-described method for manufacturing needle-like silicon whiskers, a silicon microstructure having a shape different from the needle-like silicon whiskers can be manufactured in such a manner that the thickness of a silicide layer which is formed by reaction with silicon is greater than or equal to 100 nm and the grain size of each silicide grain is greater than or equal to 50 nm.

FIG. 4 is a schematic cross-sectional view of a semiconductor film including silicon structures formed over the substrate 101, which is one embodiment of the present invention.

The semiconductor film illustrated in FIG. 4, which includes dome-like silicon structures, includes a metal layer 149 over the substrate 101, a silicide layer 143 which is formed in such a manner that the vicinity of a surface of the metal layer 149 is silicided, and a large number of silicide grains 145 in the vicinity of or adjacent to a surface of the silicide layer 143. Further, a silicon layer 147 including a plurality of dome-like silicon structures (silicon structures 151 to 154) is formed so as to be in contact with and to cover the silicide layer 143 and the large number of silicide grains 145.

The silicon structures 151 to 154 are silicon microstructures which have a dome-like shape (including a hemispherical shape and a columnar shape having a hemisphere top) and crystallinity. The silicon structures 151 to 154 do not have a clear boundary with the silicon layer 147, as in the needle-like silicon whiskers.

The silicide layer 143 has a thickness of greater than or equal to 100 nm, and includes the large number of silicide grains 145 in the vicinity of or adjacent to the surface. The grain sizes of the silicide grains 145 are greater than or equal to 50 nm.

Note that similarly to the above, the silicide layer 143 and the silicide grains 145 do not necessarily have uniform compositions. The proportion of silicon in the composition tends to be higher toward the interface with the silicon layer 147.

In FIG. 4, the metal layer 149 which does not react with silicon remains between the substrate 101 and the silicide layer 143. The metal layer 149 entirely becomes the silicide layer 143 in some cases depending on the thickness of the metal layer before deposition of silicon, deposition conditions of silicon, and the like.

In order to form such dome-like silicon structures 151 to 154, in the steps described in Embodiment 1, first, the metal layer is formed over the substrate so that the thickness of the silicide layer after silicide reaction is greater than or equal to 100 nm. After that, the silicon layer 147 is formed so that the thickness of the silicide layer is greater than or equal to 100 nm. Thus, the silicon structures 151 to 154 can be formed.

In deposition of silicon, compressive stress generated due to volume expansion is relieved in a film thickness direction as silicide reaction proceeds deeper in the film thickness direction (toward the metal layer). As a result, the height difference of depressions and projections of the surface of the silicide layer becomes small and the grain size of the silicide grain detached from the projection portions becomes large. The silicon structures which grow from the large silicide grains are likely to have not a needle-like shape but a dome-like (hemispherical) shape. A semiconductor film including the dome-like (hemisphere) silicon structures, which is manufactured by such a method, includes large silicide grains around an interface between the silicon layer and the silicide layer. The grain size of the silicide grain is greater than or equal to 50 nm.

As in Modification Example 1, dome-like silicon structures can be formed over a substrate including a metal with which silicide is formed.

Such a semiconductor film including dome-like silicon structures can have a larger surface area than a general silicon film. Moreover, the dome-like silicon structures are lower in a thickness direction than the needle-like silicon whiskers. Therefore, for example, in the case where the dome-like silicon structures are used for an active material of an electrode of a power storage device, the distance between an electrode and a separator can be shortened; accordingly, an extremely thin power storage device with improved charge-discharge characteristics can be provided.

Note that this embodiment can be combined with any of the other embodiments and examples in this specification as appropriate.

Embodiment 2

As described in Embodiment 1, with the use of the method for manufacturing a semiconductor film including needle-like silicon whiskers, which is one embodiment of the present invention, needle-like silicon whiskers can be formed at extremely high density. However, when such needle-like silicon whiskers formed at extremely high density are used for an active material of an electrode of a power storage device, a problem occurs in some cases. For example, in the case of a lithium ion power storage device, when a lithium ion is taken in an active material in charging and discharging, volume expansion occurs in the active material. When the needle-like silicon whiskers formed at extremely high density according to one embodiment of the present invention are used for the active material, the needle-like silicon whiskers might interfere or contact with each other and might be broken due to this volume expansion. Accordingly, in this embodiment, a semiconductor film including needle-like silicon whiskers formed at controlled density and a manufacturing method thereof will be described.

Figure 5A:
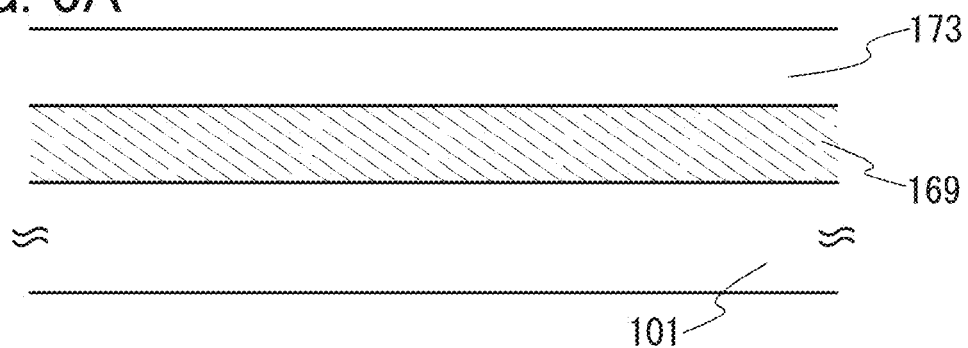
FIGS. 5A to 5C illustrate a method for manufacturing a semiconductor film according to one embodiment of the present invention.
Figure 5B:
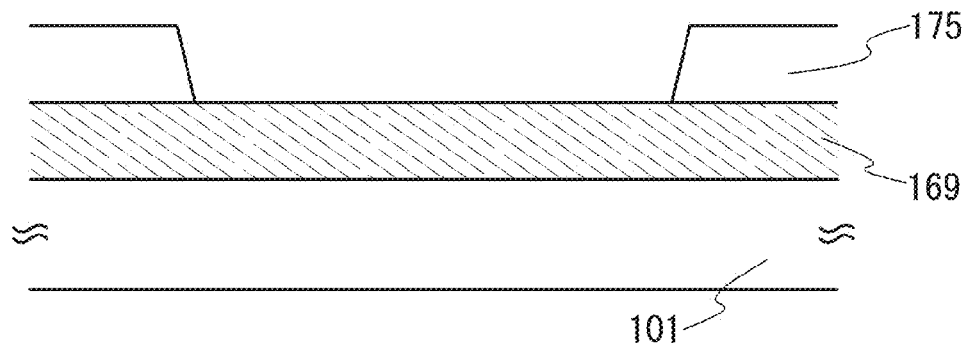
Figure 5C:
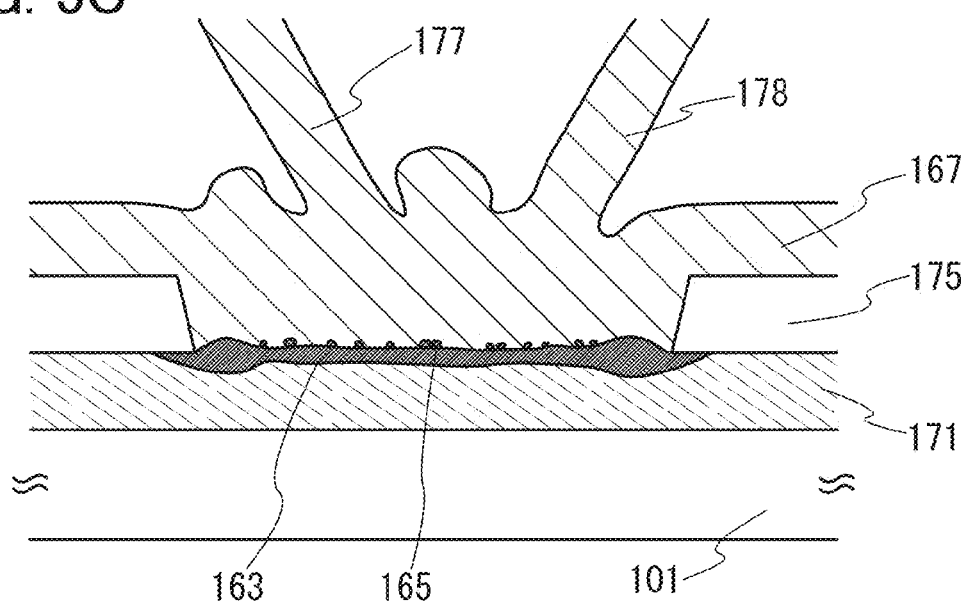

FIG. 5C is a schematic cross-sectional view of a semiconductor film including needle-like silicon whiskers selectively formed, which is described in this embodiment as an example.

The semiconductor film described in this embodiment includes a metal layer 171 over the substrate 101, and an insulating layer 175 which is on and in contact with the metal layer 171 and has an opening portion. In the opening portion of the insulating layer 175, a silicide layer 163 including silicide formed in such a manner that a metal element included in the metal layer 171 reacts with silicon, and a large number of silicide grains 165 in the vicinity of or adjacent to a surface of the silicide layer 163 are included. Further, a silicon layer 167 including a plurality of needle-like silicon whiskers 177 and 178 is formed so as to be in contact with and to cover the insulating layer 175, the silicide layer 163, and the silicide grains 165. The silicon whiskers 177 and 178 are formed in a region overlapping with the opening portion of the insulating layer 175 and the silicide layer 163. A silicon whisker is not formed in a region of the silicon layer 167 which overlaps with the insulating layer 175.

Any of the substrates numbered 101 described in Embodiment 1 can be used as the substrate 101 in this embodiment. Similarly, any of the metals described in Embodiment 1 can be used as the metal element included in the metal layer 171.

The silicide layer 163 includes silicide formed by reaction between the metal element included in the metal layer 171 and silicon. The large number of silicide grains 165 is dispersed in the vicinity of or adjacent to the surface of the silicide layer 163. The silicide layer 163 and the silicide grains 165 have features similar to the features of the silicide layers and the silicide grains described in Embodiment 1. Here, in the silicide layer 163, the thickness of a region except for a region around a peripheral portion is greater than or equal to 1 nm and less than 100 nm. The grain sizes of the silicide grains 165 are greater than or equal to 1 nm and less than 50 nm.

As illustrated in FIG. 5C, the silicide layer 163 may have a portion with a large thickness in a peripheral portion of the opening portion of the insulating layer 175. The portion with a large thickness is generated because the silicide protrudes upward in this portion due to concentration of compressive stress generated due to volume expansion in silicide reaction in the peripheral portion of the opening portion of the insulating layer 175, or the silicide reaction proceeds deep in a film thickness direction. The silicide layer 163 may be formed under the insulating layer 175 in the peripheral portion of the opening portion.

The silicon layer 167 is formed so as to cover the insulating layer 175 and its opening portion, whereas the needle-like silicon whiskers 177 and 178 are formed only in the opening portion of the insulating layer 175. Accordingly, an opening portion is formed in a region of the insulating layer 175, where needle-like silicon whiskers are to be formed, so that the needle-like silicon whiskers can be selectively formed; thus, the density of the needle-like silicon whiskers over a substrate can be controlled as appropriate.

Next, a method for manufacturing the needle-like silicon whiskers will be described with reference to FIGS. 5A to 5C.

First, the metal layer 169 and the insulating layer 173 are formed over the substrate 101. The metal layer 169 can be formed using the material and the method similar to those described in Embodiment 1.

As the insulating layer 173, an insulating film which can withstand heat in a later step, such as a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, or a gallium oxide film is used. The insulating layer 173 can be formed by a method which is used for a manufacturing step of a general semiconductor, such as a plasma CVD method or a sputtering method. Note that without limitation to an inorganic insulating film, an organic insulating film can be used as long as it has heat resistance enough to withstand heat treatment in a later step.

In this embodiment, as the metal layer 169 over a glass substrate and the insulating layer 173, a 300-nm-thick titanium film and a 450-nm-thick silicon oxynitride film are formed by a sputtering method (FIG. 5A).

After that, the insulating layer 173 is selectively etched by a known photolithography method, so that the insulating layer 175 including the opening portion is formed (FIG. 5B).

Although the formation method of the opening portion in the insulating layer 173 is not particularly limited, a fine opening pattern can be formed by a photolithography method. Specifically, the size of the opening portion and the distance between adjacent opening portions can be as small as the size substantially equal to the diameter of a needle-like silicon whisker. In the case where an opening pattern is large, that is, the size of the opening portion and the distance between adjacent opening portions are large, an opening portion in which needle-like silicon whiskers are formed at high density and a region in which no silicon whisker is formed are provided over a substrate. In the case where such a substrate is used for an active material of an electrode of a power storage device, in the region where the needle-like silicon whiskers are formed at high density, the silicon whiskers might interfere or contact with each other and might be broken due to volume expansion in charging and discharging, as described above. However, when a fine pattern, which is substantially equivalent to the diameter of a needle-like silicon whisker, is formed by a photolithography method, the number of silicon whiskers formed in one opening portion can be reduced, and the distance between the opening portions can be small so that silicon whiskers do not interfere or contact with each other; thus, the needle-like silicon whiskers can be uniformly formed at optimal density over a substrate, which is preferable.

After that, the silicon layer 167, and the needle-like silicon whiskers 177 and 178 are formed over the insulating layer 175 and the metal layer 169 which is exposed in the opening portion of the insulating layer 175. Silicon can be deposited by a method similar to that described in Embodiment 1.

In formation of the silicon layer 167, in the opening portion of the insulating layer 175, the silicide layer 163 including silicide formed by reaction between the metal element included in the metal layer 169 and silicon, and the large number of silicide grains 165 in the vicinity of or adjacent to the surface of the silicide layer 163 are formed, and the unreacted metal layer 171 remains under the silicide layer 163 and the silicide grains 165.

Since the silicide grains 165 which are nuclei of growth of the needle-like silicon whiskers are formed only in the opening portion of the insulating layer 175, the needle-like silicon whiskers are selectively formed only in a region overlapping with the opening portion, and no needle-like silicon whisker is formed in a region including the insulating layer 175.

Through the above steps, needle-like silicon whiskers can be selectively formed over a substrate. The needle-like silicon whiskers are thus selectively formed, whereby the density of the needle-like silicon whiskers over a substrate can be controlled as appropriate. When the needle-like silicon whiskers whose density is thus controlled are used for an active material of an electrode of a power storage device, a highly reliable power storage device with improved charge-discharge capacity can be provided.

In this embodiment, although the substrate 101 is used, a substrate including a metal capable of forming silicide by reacting with silicon may be used, as described in Modification Example 1 in Embodiment 1, in which case an insulating layer having an opening portion is formed over the substrate and needle-like silicon whiskers are selectively formed.

Further, silicon structures may be selectively formed in a desired region by such a manner that a metal layer is formed over a substrate and then etched with the desired region for forming silicon structures left. With such a formation method, manufacturing steps can be simplified.

Furthermore, when the manufacturing method which is described in this embodiment and the method for manufacturing dome-like silicon structures which is described in Modification Example 2 in Embodiment 1 are combined, dome-like silicon structures can be selectively formed.

Note that this embodiment can be combined with any of the other embodiments and examples in this specification as appropriate.

Embodiment 3

Any of the silicon structures described in Embodiment 1 and Embodiment 2 can be used for an electrode of a power storage device. A secondary battery or a capacitor can be formed using at least a pair of electrodes, an electrolyte, and a separator.

In this embodiment, as an example of the power storage device, a lithium ion secondary battery in which one electrode is formed using any of the silicon structures described in Embodiment 1 and Embodiment 2 and the other electrode is formed using a lithium-containing metal oxide such as $LiCoO_2$, and a manufacturing method of the lithium ion secondary battery will be described with reference to FIGS. 6A and 6B.

Figure 6A:
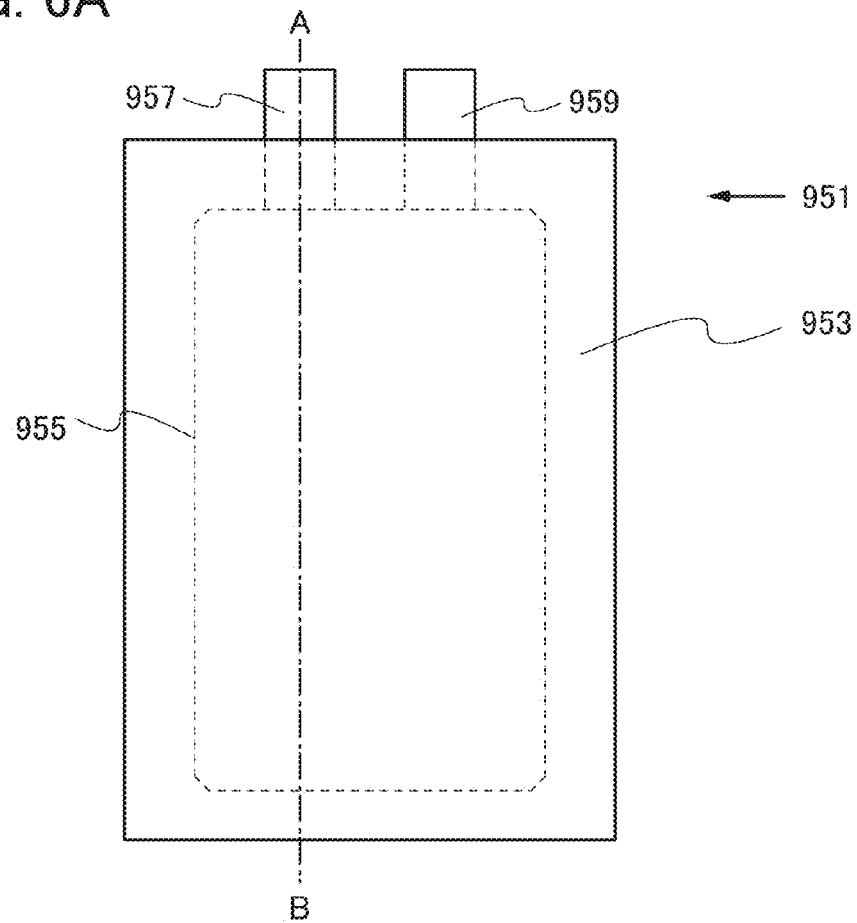
FIGS. 6A and 6B illustrate a power storage device according to one embodiment of the present invention.
Figure 6B:
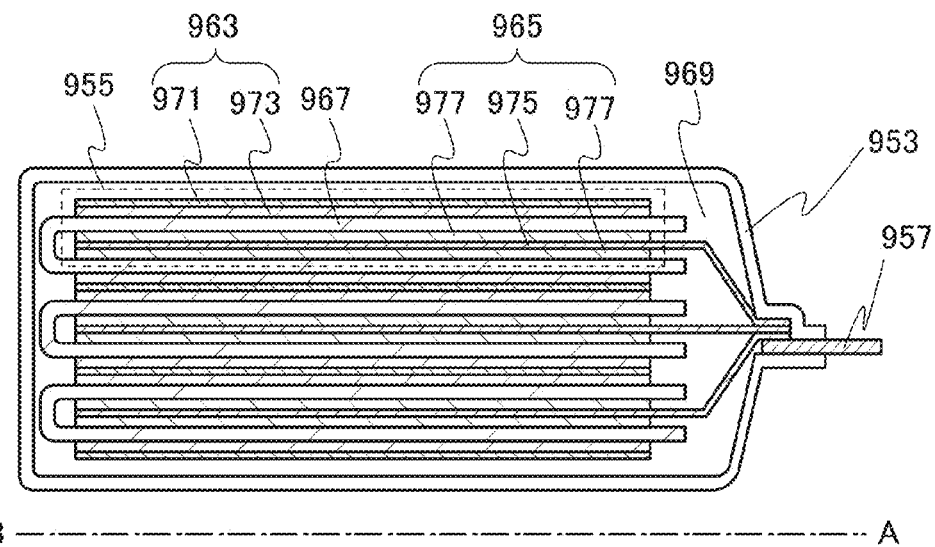

FIG. 6A is a plan view of a power storage device 951, and FIG. 6B is a cross-sectional view taken along dot-dashed line A-B in FIG. 6A.

The power storage device 951 illustrated in FIG. 6A includes a power storage cell 955 in an exterior member 953. Terminal portions 957 and 959 which are connected to the power storage cell 955 are also provided. As the exterior member 953, a laminate film, a polymer film, a metal film, a metal case, a plastic case, or the like can be used.

As illustrated in FIG. 6B, the power storage device 951 includes a negative electrode 963, a positive electrode 965, a separator 967 provided between the negative electrode 963 and the positive electrode 965, and an electrolyte 969 with which the exterior member 953 is filled. As illustrated in FIG. 6B, one power storage cell 955 includes the negative electrode 963, the positive electrode 965, and the separator 967.

The negative electrode 963 includes a negative electrode current collector 971 and a negative electrode active material layer 973. As the negative electrode, any of the substrates each including a metal, which are described in Embodiment 1 and Embodiment 2, can be used.

The negative electrode active material layer 973 can be formed using an active material layer which is provided with any of the semiconductor films including silicon structures described in Embodiment 1 and Embodiment 2. Note that the silicon structure layer may be pre-doped with lithium. In addition, the negative electrode active material layer 973 which is formed using a crystalline silicon layer can be formed with the negative electrode current collector 971 held by a frame-like susceptor in an LPCVD apparatus, whereby the negative electrode active material layer 973 can be formed on both of the surfaces of the negative electrode current collector 971 at the same time, so that the number of manufacturing steps can be reduced.

The positive electrode 965 includes a positive electrode current collector 975 and a positive electrode active material layer 977.

The negative electrode active material layer 973 is formed on one or both of the surfaces of the negative electrode current collector 971. The positive electrode active material layer 977 is formed on both of the surfaces of the positive electrode current collector 975.

The negative electrode current collector 971 is connected to the terminal portion 959. The positive electrode collector 975 is connected to the terminal portion 957. Further, parts of the terminal portions 957 and 959 extend out from the exterior member 953.

Note that although a sealed thin power storage device is described as the power storage device 951 in this embodiment, a storage device can have a variety of structures; for example, a button power storage device, a cylindrical power storage device, or a rectangular power storage device can be used. Further, although the structure where the positive electrode, the negative electrode, and the separator are stacked is described in this embodiment, a structure where the positive electrode, the negative electrode, and the separator are rolled may be employed.

Aluminum, stainless steel, or the like is used for the positive electrode collector 975. The positive electrode current collector 975 can have a foil shape, a plate shape, a net shape, or the like as appropriate.

The positive electrode active material layer 977 can be formed using $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or other lithium compounds as a material. Note that when carrier ions are alkali metal ions other than lithium ions or alkaline earth metal ions, the positive electrode active material layer 977 can be formed using, instead of lithium in the above lithium compounds, an alkali metal (e.g., sodium or potassium), an alkaline earth metal (e.g., calcium, strontium, or barium), beryllium, or magnesium can be used.

As a solute of the electrolyte 969, a material in which lithium ions, which are carrier ions, can move and stably exist is used. Typical examples of the solute of the electrolyte include lithium salt such as $LiClO_4$, $LiAsF_6$, $LiBF_4$, $LiPF_6$, and $Li(C_2F_5SO_2)_2N$. Note that when carrier ions are alkali metal ions other than lithium ions or alkaline earth metal ions, the solute of the electrolyte 969 can be formed using alkali metal salt such as sodium salt or potassium salt, alkaline earth metal salt such as calcium salt, strontium salt, or barium salt, beryllium salt, magnesium salt, or the like can be used as appropriate.

As a solvent of the electrolyte 969, a material which can transfer lithium ions is used. As the solvent of the electrolyte 969, an aprotic organic solvent is preferably used. Typical examples of aprotic organic solvents include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 969, safety against liquid leakage or the like is increased. In addition, the power storage device 951 can be thin and lightweight. Typical examples of gelled polymers include a silicon gel, an acrylic gel, an acrylonitrile gel, polyethylene oxide, polypropylene oxide, a fluorine-based polymer, and the like.

As the electrolyte 969, a solid electrolyte such as $Li_3PO_4$ can be used.

For the separator 967, an insulating porous material is used. Typical examples of the separator 967 include cellulose (paper), polyethylene, and polypropylene.

A lithium ion battery has a small memory effect, a high energy density, and a large discharge capacity. In addition, the driving voltage of a lithium ion battery is high. Thus, the size and weight of the lithium ion battery can be reduced. Further, the lithium ion battery does not easily degrade due to repetitive charge and discharge and can be used for a long time, so that cost can be reduced.

Next, a capacitor is described as a power storage device. Typical examples of capacitors include a double-layer capacitor, a lithium ion capacitor, and the like.

In the case of a capacitor, instead of the positive electrode active material layer 977 in the secondary battery in FIG. 6A, a material capable of reversibly occluding or adsorbing lithium ions and/or anions is preferably used. Typical examples of such a material include active carbon, a conductive polymer, and a polyacene organic semiconductor (PAS).

The lithium ion capacitor has high efficiency of charge and discharge, capability of rapidly performing charge and discharge, and a long life even when it is repeatedly used.

By using the negative electrode including any of the silicon structures described in Embodiment 1 and Embodiment 2 as the negative electrode 963, a power storage device with a high discharge capacity and less degradation of an electrode due to repetitive charge and discharge can be manufactured.

Further, when the current collector and the active material layer which include any of the silicon structures described in Embodiment 1 and Embodiment 2 are used for a negative electrode of an air cell that is one embodiment of a power storage device, a power storage device with a high discharge capacity and less degradation of an electrode due to repetitive charge and discharge can be manufactured.

Note that this embodiment can be combined with any of the other embodiments and examples in this specification as appropriate.

Embodiment 4

The needle-like silicon whiskers having such an advantageous shape, which are described in Embodiment 1 and Embodiment 2, can also be used for, for example, an electron gun, microelectromechanical systems (MEMS), and a probe in a measuring instrument.

Moreover, in this embodiment, an application example of the power storage device described in Embodiment 3 will be described with reference to FIG. 7 and FIGS. 8A and 8B.

The power storage device described in Embodiment 3 can be used in electronic devices such as cameras such as digital cameras or video cameras, digital photo frames, mobile phones (also referred to as cellular phones or cellular phone devices), portable game machines, portable information terminals, and audio reproducing devices. Further, the power storage device can be used in electric propulsion vehicles such as electric vehicles, hybrid electric vehicles, train vehicles, maintenance vehicles, carts, or wheelchairs. Here, as typical examples of the electric propulsion vehicles, an electric bicycle and an electric vehicle will be described.

FIG. 7 is a perspective view of an electric bicycle (or a power-assisted bicycle). An electric bicycle 1001 includes a saddle 1002 on which the rider sits, pedals 1003, a frame 1004, two wheels 1005, handlebars 1006 for steering one of the wheels 1005, a driver portion 1007 attached to the frame 1004, and a display device 1008 provided near the handlebars 1006.

The driver portion 1007 includes a motor, a battery, a controller, and the like. The controller detects conditions of the battery (e.g., current, voltage, or a temperature of the battery). The controller adjusts the discharge amount of the battery to control the motor when the electric bicycle 1001 moves, while the controller controls the charge amount when the battery is charged. Further, the driver portion 1007 may be provided with a sensor which senses the pressure that the rider puts on the pedals 1003, the driving speed, and the like and the motor may be controlled according to information from the sensor. Note that while FIG. 7 illustrates a structure where the driver portion 1007 is mounted on the frame 1004, the mounting position of the driver portion 1007 is not limited thereto.

The display device 1008 includes a display portion, a switching button, and the like. The display portion displays the remaining battery level, the driving speed, and the like. In addition, with the switching button, the motor can be controlled or the display content on the display portion can be changed. Note that while FIG. 7 illustrates a structure where the display device 1008 is mounted near the handlebars 1006, the mounting position of the display device 1008 is not limited thereto.

The power storage device described in Embodiment 3 can be used for the battery of the driver portion 1007. The battery of the driver portion 1007 can be externally charged by electric power supply using a plug-in system or contactless power feeding. Further, the power storage device described in Embodiment 3 can be used for the display device 1008.

Figure 8A:
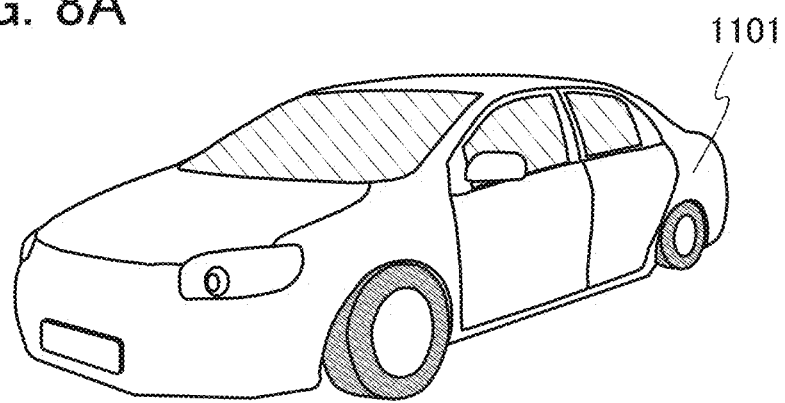
FIGS. 8A and 8B illustrate an electric vehicle according to one embodiment of the present invention.
Figure 8B:
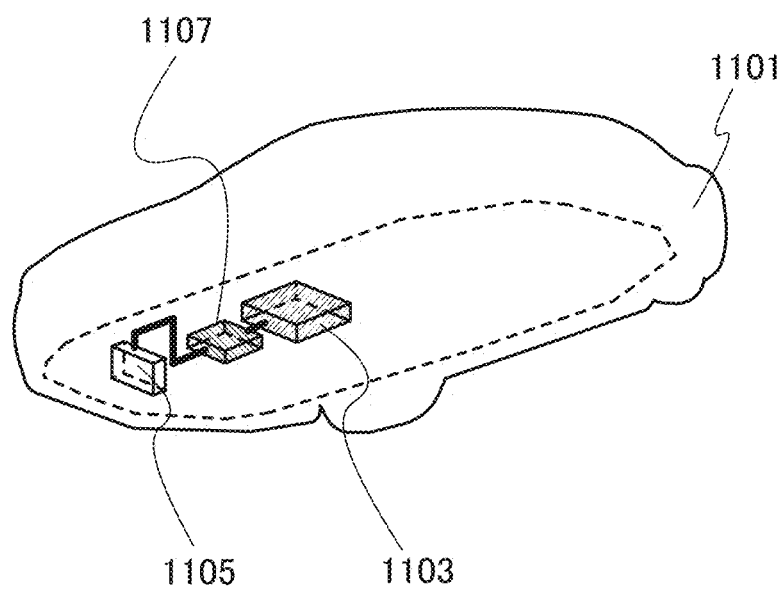

FIG. 8A is a perspective view of an electric vehicle 1101. FIG. 8B is a transparent view of the electric vehicle 1101 illustrated in FIG. 8A. The electric vehicle 1101 obtains power when current flows through a motor 1103. The electric vehicle 1101 includes a battery 1105 and a power control portion 1107 for supplying power for making current flow though the motor 1103. Although a means to charge the battery 1105 is not particularly illustrated in FIGS. 8A and 8B, the battery 1105 may be charged by an electric generator or the like that is additionally provided.

The power storage device described in Embodiment 3 can be used in the battery 1105. The battery 1105 can be externally charged by electric power supply using plug-in systems or contactless power feeding. Note that in the case where the electric propulsion vehicle is a train vehicle, the battery can be charged by electric power supply from an overhead cable or a conductor rail.

Note that this embodiment can be combined with any of the other embodiments and examples in this specification as appropriate.

Example 1

In this example, a semiconductor film including needle-like silicon whiskers and a semiconductor film including dome-like silicon structures are manufactured by the methods described in Embodiment 1, and the semiconductor films are observed.

Hereinafter, a sample in which the semiconductor film including the needle-like silicon whiskers is formed is referred to as Sample 1, and a sample in which the semiconductor film including the dome-like silicon structures is formed is referred to as Sample 2.

First, titanium films are formed over glass substrates by a sputtering method. The thickness of the titanium film of Sample 1 is 10 nm, and the thickness of the titanium film of Sample 2 is 300 nm.

Next, a silicon film is formed over each of the samples by an LPCVD method. In film formation, a film formation gas in which $SiH_4$ and $N_2$ are mixed at a ratio of 1:1 is used; the pressures is set to 20 Pa; and the temperature is kept at 600° C. for one hour. Thus, Sample 1 and Sample 2 each including silicon structures are obtained.

Figure 9A:
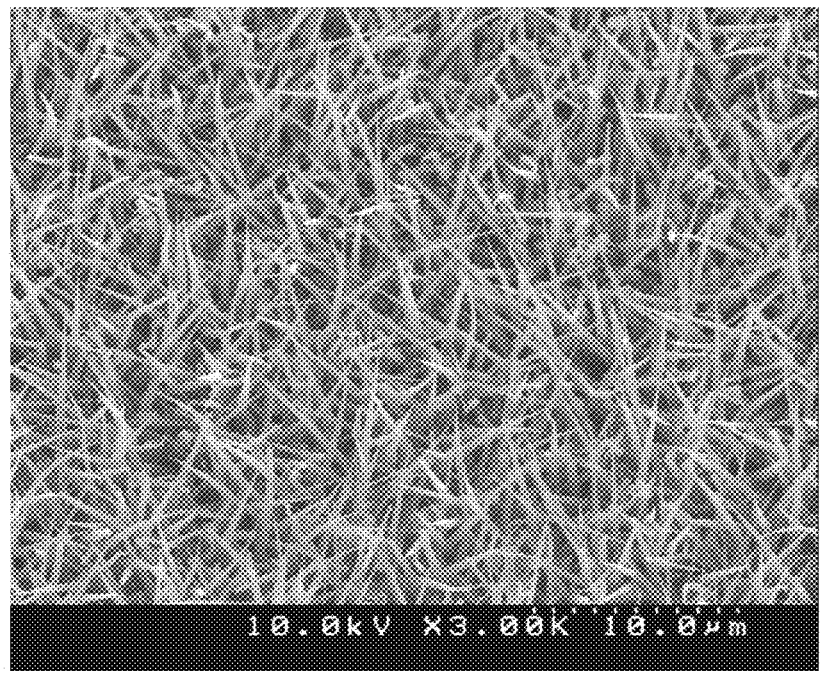
FIGS. 9A and 9B are SEM images of semiconductor films of Example 1.
Figure 9B:
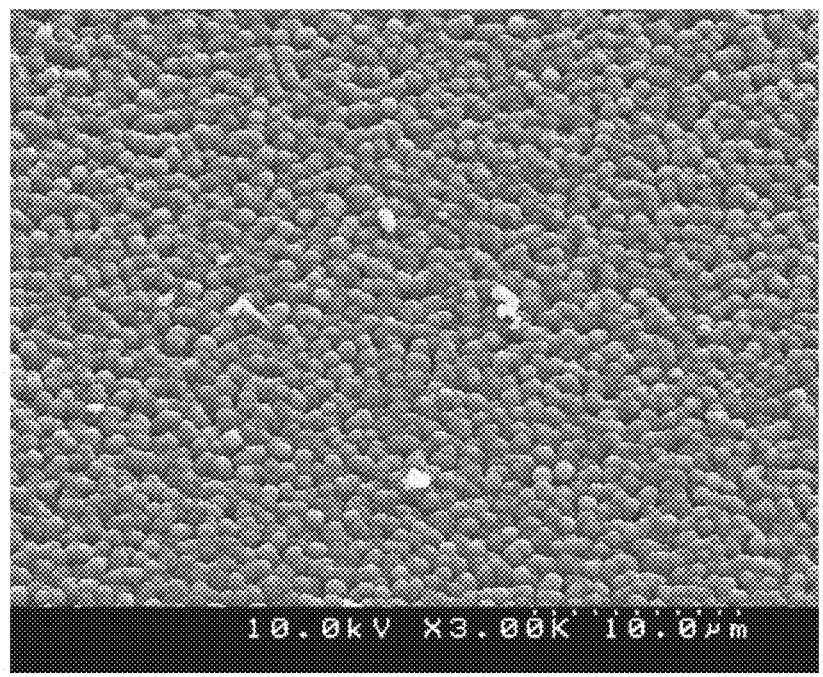

Next, Sample 1 and Sample 2 are observed by scanning electron microscopy (SEM). FIG. 9A is an observation result of Sample 1, and FIG. 9B is an observation result of Sample 2.

In Sample 1, it is confirmed that needle-like silicon whiskers are formed at extremely high density. In Sample 2, it is confirmed that dome-like (hemispherical) silicon structures are formed at extremely high density.

Figure 10A:
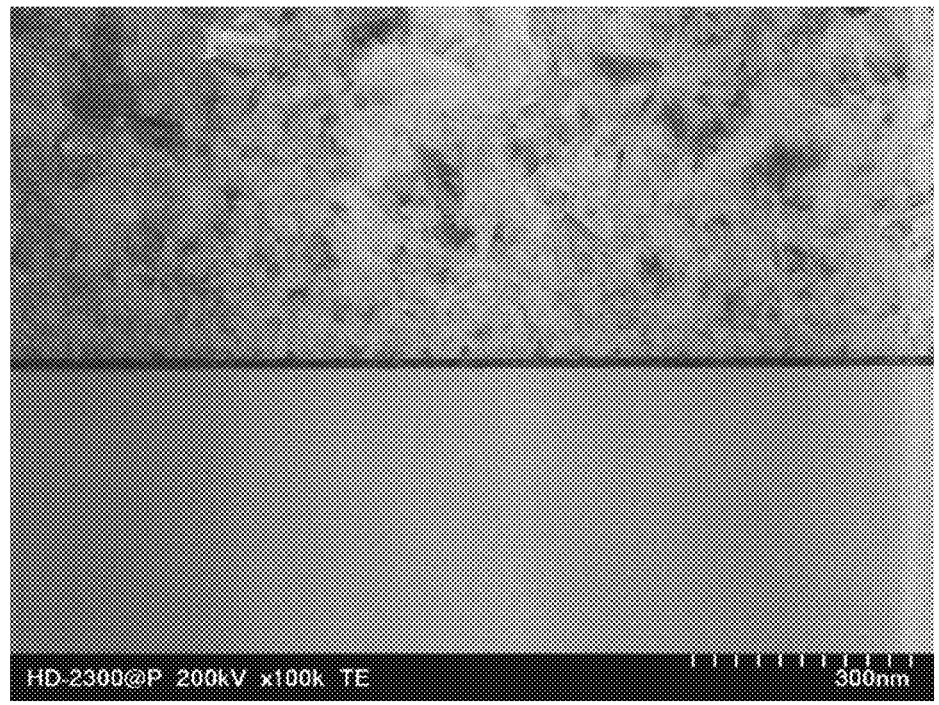
FIGS. 10A and 10B are STEM images of semiconductor films of Example 1.
Figure 10B:
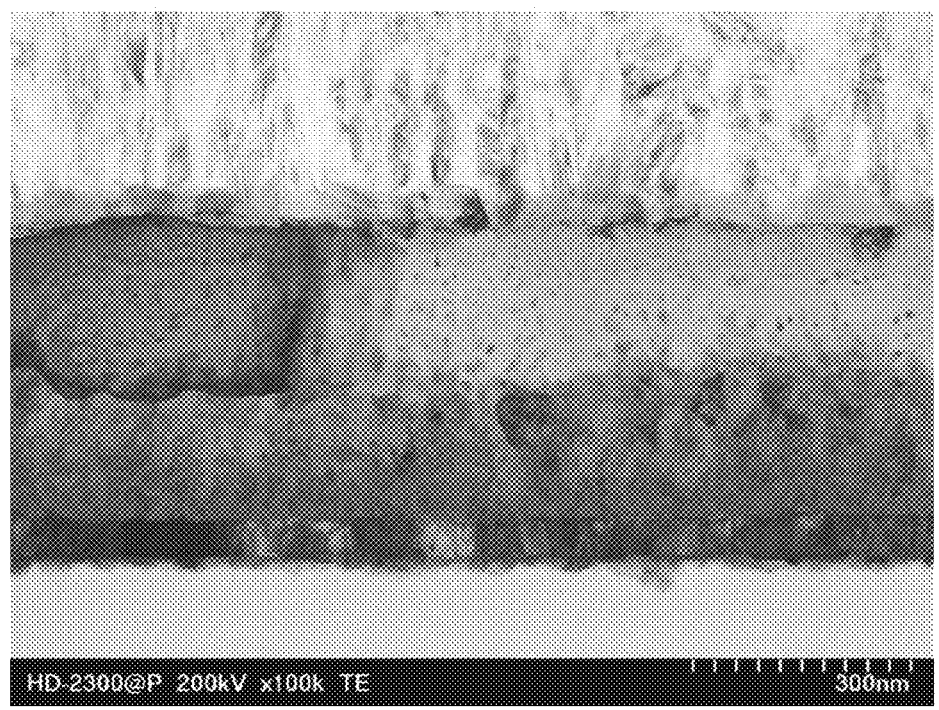

Next, cross sections of the vicinity of silicide layers of Sample 1 and Sample 2 are observed by scanning transmission electron microscopy (STEM). FIG. 10A is an observation result of Sample 1, and FIG. 10B is an observation result of Sample 2.

In Sample 1, a plurality of silicide grains having an average grain size of approximately 18 nm is observed over the silicide layer having a thickness of approximately 11 nm over the glass substrate and the silicon layer covers them.

In Sample 2, a titanium layer having a thickness of approximately 50 nm over the glass substrate, a titanium silicide layer having a thickness of approximately 410 nm over the titanium layer, and a plurality of silicide grains having an average grain size of approximately 64 nm over the titanium silicide layer are observed, and a silicon layer covers them. Further, the titanium silicide layer included two layers whose compositions are greatly different from each other. It is confirmed that the lower layer included silicide having low silicon concentration and the upper layer included silicide having high silicon concentration.

Note that this example can be combined with the other example and any of the embodiments described in this specification as appropriate.

Example 2

In this example, dome-like silicon structures are formed by the method described in Embodiment 1, and an attempt is made to identify crystal structures of a silicide layer and silicide grains in the vicinity of an interface with a silicon layer by an electron diffraction method.

First, a 100-nm-thick titanium film is formed over a glass substrate by a sputtering method. Then, a silicon film is formed by an LPCVD method. In film formation, a film formation gas in which $SiH_4$ and $N_2$ are mixed at a ratio of 1:1 is used; the pressure is set to 20 Pa; and the temperature is kept at 600° C. for one hour. Thus, Sample 3 including dome-like silicon structures is obtained.

Figure 11:
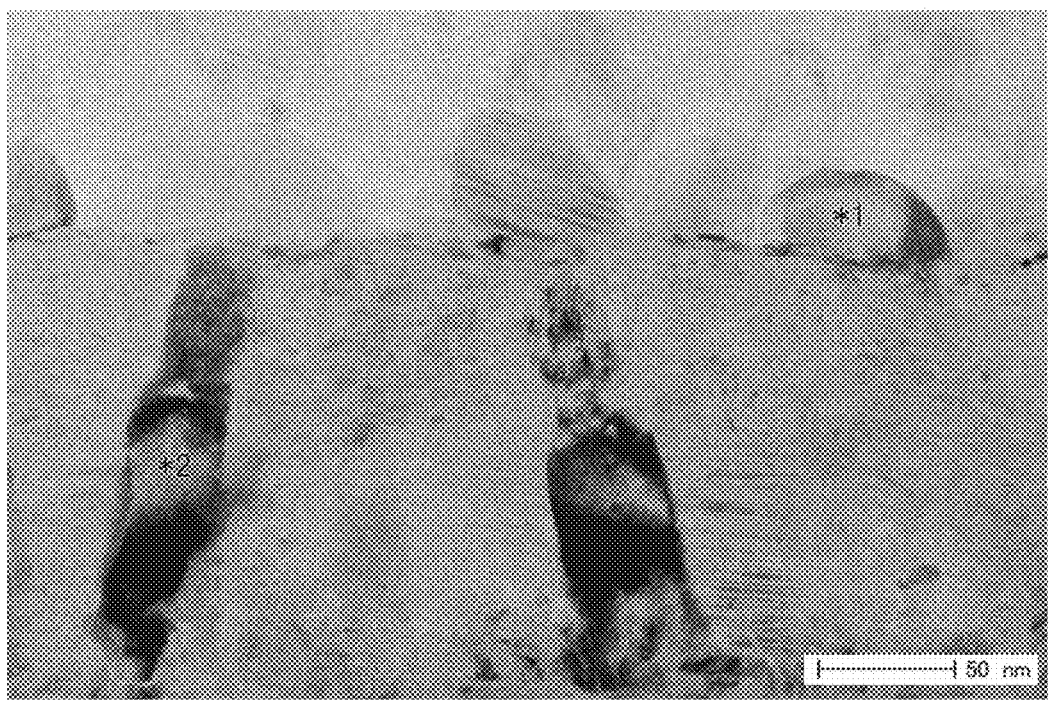
FIG. 11 is a STEM image of a semiconductor film of Example 2.

Then, a cross section of the vicinity of the silicide layer of Sample 3 is observed by STEM. FIG. 11 is an observation result of the cross section.

From the observation result of the cross section, it is confirmed that the silicide layer in the vicinity of an interface with the silicon layer is a polycrystalline layer including a large number of grains. It is also confirmed that a large number of silicide grains existed over the silicide layer.

Then, diffraction patterns of the silicide grains and the silicide layer are observed by an electron diffraction method in an attempt to identify the crystal structures. The measurement is performed in a region 1 in the silicide grain and a region 2 in the silicide layer in FIG. 11.

Figure 12A:
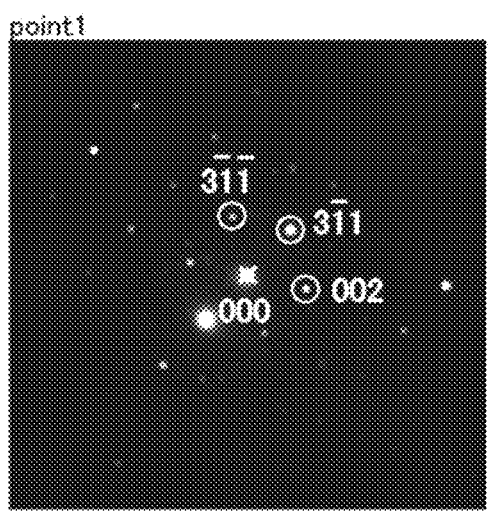
FIGS. 12A and 12B are electron diffraction images of a semiconductor film of Example 2.
Figure 12B:
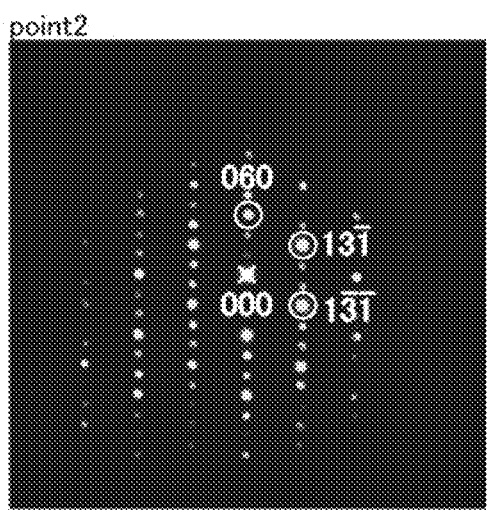

FIGS. 12A and 12B are electron diffraction patterns in the regions 1 and 2, respectively. Identification of the crystal structures is performed based on a group of measured diffraction spots. Plane indices corresponding to several diffraction spots are indicated in FIGS. 12A and 12B.

From the diffraction pattern in FIG. 12A, it is confirmed that the crystal structure in the region 1 is C54 phase $TiSi_2$ and the diffraction pattern in FIG. 12A is a diffraction pattern with [130] incidence.

From the diffraction pattern in FIG. 12B, it is confirmed that the crystal structure in the region 2 is C49 phase $TiSi_2$ and the diffraction pattern in FIG. 12B is a diffraction pattern with [101] incidence.

From the above results, it is confirmed that the silicide layer in the vicinity of the interface with the silicon layer included crystalline silicon-rich silicide. Moreover, it is found that the silicide grains also included crystalline silicon-rich silicide.

Further, it is confirmed that titanium silicide included in the silicide layer and titanium silicide included in the silicide grains had different crystal structures.

Note that this example can be combined with the other example and any of the embodiments described in this specification as appropriate.

This application is based on Japanese Patent Application serial no. 2010-263710 filed with Japan Patent Office on Nov. 26, 2010, the entire contents of which are hereby incorporated by reference.

What is claimed is:

1. A semiconductor film comprising:
   a silicide layer comprising a metal;
   a silicide grain over the silicide layer; and
   a first silicon layer in contact with the silicide layer and the silicide grain,
   wherein the first silicon layer comprises a needle-like silicon structure,
   wherein a thickness of the silicide layer is greater than or equal to 1 nm and less than 100 nm, and
   wherein a grain size of the silicide grain is greater than or equal to 1 nm and less than 50 nm.

2. The semiconductor film according to claim 1, wherein the silicide layer and the silicide grain comprise titanium.

3. The semiconductor film according to claim 1, wherein the silicide layer and the silicide grain comprise at least one of nickel, cobalt, zirconium, hafnium, vanadium, niobium, tantalum, chromium, molybdenum, and tungsten.

4. A power storage device comprising a negative electrode, wherein the negative electrode comprises the semiconductor film according to claim 1.

5. A film comprising:
   a first region comprising the semiconductor film according to claim 1; and
   a second region comprising:
     a metal layer comprising the metal;
     an insulating layer over the metal layer; and
     a second silicon layer over the insulating layer,
   wherein the first region and the second region are formed over a substrate, and
   wherein the first silicon layer of the first region and the second silicon layer of the second region are continuous.

6. The film according to claim 5, wherein the silicide layer and the silicide grain comprise titanium.

7. The film according to claim 5, wherein the silicide layer and the silicide grain comprise at least one of nickel, cobalt, zirconium, hafnium, vanadium, niobium, tantalum, chromium, molybdenum, and tungsten.

8. A power storage device comprising a negative electrode, wherein the negative electrode comprises the film according to claim 5.

9. A semiconductor film comprising:
a silicide layer comprising a metal;
a silicide grain over the silicide layer; and
a first silicon layer in contact with the silicide layer and the silicide grain,
wherein the first silicon layer comprises a dome-like silicon structure,
wherein a thickness of the silicide layer is greater than or equal to 100 nm, and
wherein a grain size of the silicide grain is greater than or equal to 50 nm.

10. The semiconductor film according to claim 9, wherein the silicide layer and the silicide grain comprise titanium.

11. The semiconductor film according to claim 9, wherein the silicide layer and the silicide grain comprise at least one of nickel, cobalt, zirconium, hafnium, vanadium, niobium, tantalum, chromium, molybdenum, and tungsten.

12. A power storage device comprising a negative electrode, wherein the negative electrode comprises the semiconductor film according to claim 9.

13. A film comprising:
a first region comprising the semiconductor film according to claim 9; and
a second region comprising:
a metal layer comprising the metal;
an insulating layer over the metal layer; and
a second silicon layer over the insulating layer,
wherein the first region and the second region are formed over a substrate, and
wherein the first silicon layer of the first region and the second silicon layer of the second region are continuous.

14. The film according to claim 13, wherein the silicide layer and the silicide grain comprise titanium.

15. The film according to claim 13, wherein the silicide layer and the silicide grain comprise at least one of nickel, cobalt, zirconium, hafnium, vanadium, niobium, tantalum, chromium, molybdenum, and tungsten.

16. A power storage device comprising a negative electrode, wherein the negative electrode comprises the film according to claim 13.

* * * * *